Figure 1:
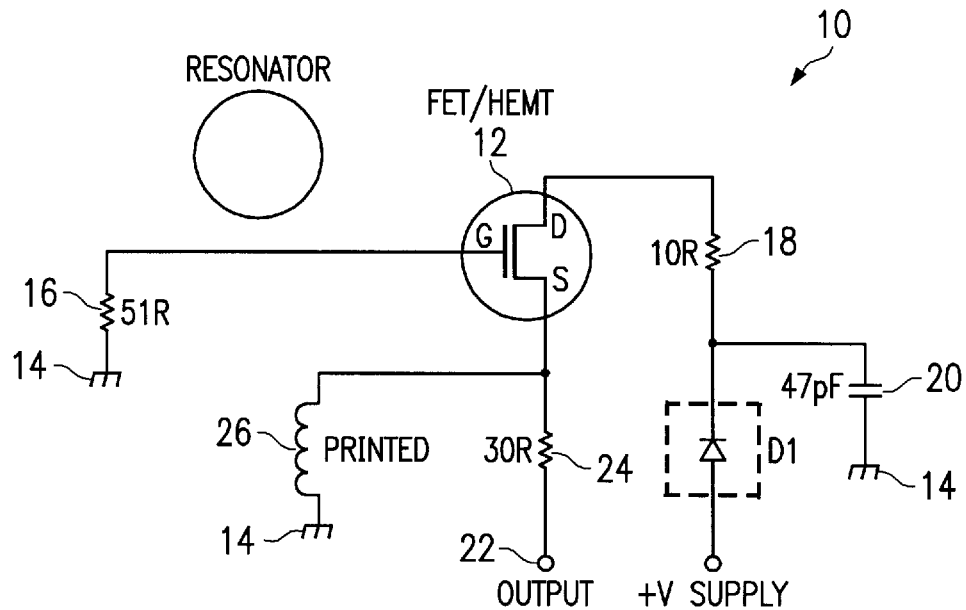

United States Patent
Orr

[11] Patent Number: 6,157,269
[45] Date of Patent: Dec. 5, 2000

[54] LOCAL OSCILLATOR NOISE REJECTION CIRCUIT

[75] Inventor: John Peter Orr, Theale, United Kingdom

[73] Assignee: Cambridge Industries Limited, United Kingdom

[21] Appl. No.: 08/952,280

[22] PCT Filed: May 17, 1996

[86] PCT No.: PCT/GB96/01188

§ 371 Date: May 4, 1998

§ 102(e) Date: May 4, 1998

[87] PCT Pub. No.: WO96/37041

PCT Pub. Date: Nov. 21, 1996

[30] Foreign Application Priority Data

May 18, 1995 [GB] United Kingdom ............... 9510028

[51] Int. Cl.[7] .................................................. H03B 5/18
[52] U.S. Cl. ................ 331/117 D; 331/96; 331/107 DP; 331/117 FE; 333/219.1
[58] Field of Search ................................ 331/96, 117 D, 331/107 DP, 117 FE, 116 FE; 333/219.1, 202, 202 DR

[56] References Cited

U.S. PATENT DOCUMENTS

| | | | |
|---|---|---|---|
| 4,590,443 | 5/1986 | Ishigaki et al. | 331/117 |
| 4,609,884 | 9/1986 | KinDinger et al. | 331/109 |
| 5,157,357 | 10/1992 | Katoh | 331/74 |

OTHER PUBLICATIONS

P. Horowits and W. Hill, "The Circuit Engineering Art," Peace Publishers, 1983, vol. 1, p. 117.

G.S. Tyskin, "Amplifying Devices," Communication Publishers, Moscow, pp. 37–39, 283, 285, 289.

*Primary Examiner*—Arnold Kinkead
*Attorney, Agent, or Firm*—Piper Marbury Rudnick & Wolfe

[57] ABSTRACT

A local oscillator noise rejection circuit is described which has a resistance between the output of an MES FET/HEMT and ground. This resistance has the effect of introducing a self-biasing arrangement to the oscillator circuit which means that when there is any increase in current through the MES PET/HEMT device, the voltage drop across the resistance also increases. Since the gate is tied to ground via a low resistance (51 Ω) this leads to an increased negative gate to source voltage which causes the device to "pinch-off" slightly which, in turn, gives a reduction in the current level through the device. This arrangement therefore has the effect of reducing any current surges within the device and produces an improvement in phase noise. In a preferred arrangement a 30 Ohm resistor is located between the source of the FET/HEMT and ground, the resistor being located in series within the printed circuit inductor and the output line. With the aforementioned modified circuit, an improvement in the phase noise performance has been measured from the standard circuit which gave a figure of –64 dBc. At 10 KHz. After modification using the above mentioned circuit a figure of –76 dBc. At 10 KHz. was obtained which is approximately a 16 times improvement.

10 Claims, 1 Drawing Sheet

LOCAL OSCILLATOR NOISE REJECTION CIRCUIT

The present invention relates to noise rejection circuitry and, particularly but not exclusively, to noise rejection techniques for use in local oscillator circuits contained within low noise blocks (LNBs) for use in satellite receiving equipment.

Due to the introduction of digital transmission standards for future satellite broadcasts, there is a greater requirement to have improved levels of phase noise in local oscillators contained within LNBs, such as that disclosed in applicant's co-pending published application PCT/GB92/01065 published as WO 92/22938.

The local oscillator is part of the general circuitry used in the LNB and its function is to create a signal which drives a mixer which also receives amplified microwave signals from the satellite. The output of the mixer is UHF (down converted) signals which contain the relevant video and audio information. It is very important that the noise from the local oscillator is minimised, otherwise this will end up on the UHF signal with a consequent reduction in video and audio quality especially for digital transmissions.

The prior art circuit is shown in FIG. 1 of the drawings. This circuit uses a field effect transistor (FET) or high electron mobility transistor (HEMT) as its principal oscillating element. The circuit shown in FIG. 1 has a ceramic resonator which acts as a filter coupled to the gate transmission line and controls the oscillation frequency. With this arrangement the output of the FET is d.c. coupled directly to ground via an inductor on the printed circuit board. This arrangement is the standard technique for a series feedback oscillator design.

However, with this arrangement there is no protection against current surges within the device which can result in fluctuations in the oscillator frequency. The result of this is an increase in phase noise leading to reduced signal quality.

EP 0 202 652 discloses a microwave oscillator circuit which uses a resistor in the d.c. path of the circuit to set the d.c. self-biasing of the FET. At high frequencies the resistor is effectively connected to an open circuit.

The proceedings of the 19th European Microwave Conference, 1989, Sep. 4, 1989, pages 549 to 554, XP000067323, Kazuo Imai et al: "A 22 Ghz Band Low Noise Down Converter for Satellite Broadcast Receivers" discloses a dielectric resonator oscillator circuit which also has a resistor in the d.c. path of the circuit. This resistor is decoupled by a capacitor and so is effectively short circuited.

An object of the present invention is to provide an improved local oscillator noise rejection circuit which obviates or mitigates the aforementioned disadvantage.

This is achieved by providing resistance between the output of the MES FET/HEMT and ground. This resistance has the effect of introducing a self-biasing arrangement to the oscillator circuit which means that when there is any increase in current through the MES FET/HEMT device, the voltage drop across the resistance also increases. Since the gate is tied to ground via a low resistance (51 Ω) this leads to an increased negative gate to source voltage which causes the device to "pinch-off" slightly which, in turn, gives a reduction in the current level through the device. This arrangement therefore has the effect of reducing any current surges within the device and produces an improvement in phase noise.

In a preferred arrangement a 30 Ohm resistor is located between the source of the FET/HEMT and ground, the resistor being located in series within the printed circuit inductor and the output line.

With the aforementioned modified circuit, an improvement in the phase noise performance has been measured from the standard circuit which gave a figure of −64 dBc. at 10 KHz. After modification using the above mentioned circuit a figure of −76 dBc. at 10 KHz. was obtained which is approximately a 16 times improvement. Simultaneously, the level of oscillator sidebands generated by an interfering 200 KHz. signal on the d.c. supply line were improved from −50 dBc. to −70 dBc. which is an improvement of two orders of magnitude. It will be understood that these figures are typical and the modified circuit has been shown, repeatedly, to give such a level of improvement over several hundred units tested and of different manufacturers FETs or HEMTs.

According to a first aspect of the present invention there is provided a local oscillator noise rejection circuit comprising an active element, said active element having a gate input, a drain input and a source output with respective transmission lines 52, 50 and 54, the gate input being coupled to ground via a first resistor and having a resonator disposed in proximity to the gate input line, said resonator being coupled to the gate transmission line, said drain input line 52 being coupled to ground via a decoupling capacitance, and being coupled to a d.c. voltage supply, said source being coupled via said source transmission line 54 to provide an oscillator output, the source being coupled to ground via an inductor and to said output via a second resistor, said circuit being characterised in that said second resistor is disposed between the source and the inductor to ground.

Preferably, said active element is a field effect transistor (FET). Alternatively, said active element is a high electron mobility transistor (HEMT).

Conveniently, said inductor is provided by a coil mounted on a printed circuit board and most preferably the inductor is printed on said circuit board. Conveniently, said resonator is a ceramic element and is disk shaped.

Preferably, the second resistor is located in the drain transmission line 50 between the drain and the decoupling capacitor. Preferably also, the drain is coupled to said d.c. voltage supply via said second resistor and a diode.

Conveniently, said second resistor is a 30 Ohm resistor which has the effect of introducing a self-biasing arrangement to the oscillator circuit so that when there is any increase in current through the device, the voltage drop across the 30 Ohm. resistor also increases, increasing the negative gate to source voltage and causing the device to "pinch-off" which then reduces the current level through the device.

According to another aspect of the present invention, there is provided a method of minimising phase noise in a local oscillator circuit of the type used in low noise blocks, said method comprising the steps of:

disposing a resistance element at the output of an active element in said oscillator circuit such that said resistance element is located between the output and an inductor which is connected to d.c. ground, and selecting the value of the resistance element so that when so located said resistance element introduces a type of self-biasing to the oscillator circuit whereby any increase in current through the active element causes an increase in voltage across said resistance element thereby causing the active element to "pinch-off" reducing the current through the active element.

It will be appreciated that the resistance element is simply achieved using a resistor and in the circuit hereinafter described a 30 Ohm resistor is used.

Figure 2:
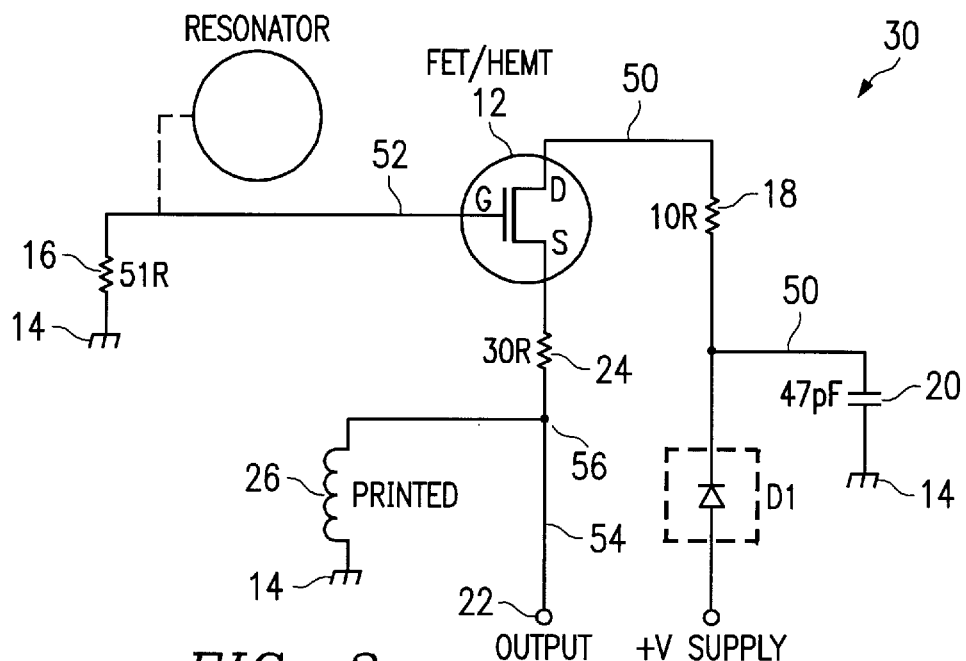

These and other aspects of the invention will become apparent from the following description when taken in combination with the accompanying drawings in which:

FIG. 1 is a circuit diagram of a series feedback local oscillator circuit which is known in the art, and FIG. 2 is an improved series feedback oscillator (noise rejection circuit) in accordance with an embodiment of the present invention.

Reference is first made to FIG. 1 of the drawings which depicts prior art circuit generally indicated by reference numeral 10. The circuit is based on a semiconductor active device 12 typically a field effect transistor (FET) or high electron mobility transistor (HEMT) 12. The circuitry shown in FIG. 1 is well known and has been included in the applicant's circuit provided with low noise blocks of the type disclosed in the aforementioned PCT application published as WO 92/22938. It will be seen that in this circuit the gate is coupled to ground 14 via a 51 Ω resistor 16 and the drain is coupled to ground via a 10 Ohm resistor 18 and a 47 picofarad decoupling capacitor 20. The drain is also coupled via resistor 18 and a diode D1 to a +d.c. supply voltage. The output of the oscillator is taken from the source of the transistor 10 and in this case the output source is connected directly to the oscillator output 22 via a 30 Ohm resistor 24. The source is also passed directly to d.c. ground 14 via an inductor 26 on a printed circuit board (not shown).

The problems with this arrangement are documented above: basically there is no protection or compensation for current surges through the device leading to a relatively large increase in phase noise. This noise is able to pass on to the UHF signal so that the signal picked up by a decoder/receiver includes this noise which degrades video and audio quality.

Reference is now made to FIG. 2 of the drawings which depicts an embodiment of an improved local oscillator noise rejection circuit 30 in accordance with the present invention. It will be seen by comparing circuits shown in FIGS. 1 and 2 that they are very similar, with like numerals referring to like parts, except that in the case of FIG. 2 the source of the FET or HEMT is connected via a 30 Ohm resistor 22 to a node 56. Node 56 is connected in series by the inductor 26 to d.c. ground 14. Node 56 is further connected to oscillator output 22. This resistor 22 has the effect of introducing self-biasing to the oscillator circuit which means that when there is any increase in current through the device, the voltage drop across the 30 Ohm resistor 22 also increases. This leads to an increased negative gate to source voltage which causes the device to "pinch-off" slightly and which then, in turn, gives a reduction in the current level through the device. This circuit therefore has the effect of reducing current surges within the device and it produces the performance improvements indicated above, namely a 16 fold reduction in phase noise at 10 KHz. and two orders of magnitude reduction in sidebands generated by an interfering 200 KHz. signal on the d.c. supply line. Phase noise is also reduced at other frequency offsets from the main oscillator carrier and the circuit will generally improve rejection of noise on the d.c. supply line.

It will be appreciated that various modifications may be made to the circuit hereinbefore described without departing from the scope of the invention. The second resistor at the drain output may be omitted as can the diode disposed in the drain bias line. The value of the 30 Ohm resistor may be varied in accordance with other oscillator parameters.

What is claimed is:

1. A local oscillator noise rejection circuit comprising an active element, said active element having a gate input, a drain input and a source output, a drain input transmission line coupled to the drain input, a gate input transmission line coupled to the gate input, a source output transmission line coupled to the source output, the gate input being coupled to ground via a first resistor and having a resonator disposed in proximity to the gate input, said resonator being coupled to the gate input transmission line, said drain input being coupled to ground via a decoupling capacitance, and being coupled to a d.c. voltage supply, said source output being connected in series via a second resistor to a node, said node being connected in series via an inductor to ground, said source output transmission line connecting said node to an oscillator output.

2. A circuit as claimed in claim 1 wherein said active element is a field effect transistor (FET).

3. A circuit as claimed in claim 1 wherein said active element is a high electron mobility transistor (HEMT).

4. A circuit as claimed in claim 1 wherein said inductor is provided by a coil mounted on a printed circuit board.

5. A circuit as claimed in claim 1 wherein said resonator is a ceramic element and is disk shaped.

6. A circuit as claimed in claim 1 wherein a third resistor is located in the drain input transmission line between the drain input and the decoupling capacitance.

7. A circuit as claimed in claim 1 wherein the drain input is coupled to said d.c. voltage supply via a third resistor and a diode.

8. A circuit as claimed in claim 1 wherein said second resistor has a resistance value of about 30 Ohms.

9. A method of minimizing phase noise in a local oscillator circuit of the type used in low noise blocks, said method comprising the steps of:

connecting a resistance element between the output of an active element and a node;

connecting the node in series via an inductor to d.c. ground;

connecting the node to an oscillator output of the oscillator circuit; and selecting the value of the resistance element so that when so located said resistance element introduces a type of self-biasing to the oscillator circuit, whereby any increase in current through the active element causes an increase in voltage across said resistance element, thereby causing the active element to "pinch-off", reducing the current through the active element.

10. A circuit as claimed in claim 1, wherein said second resistor has the effect of introducing a self-biasing arrangement to the circuit so that when there is any increase in current through the active element, the voltage drop across said second resistor also increases, increasing the negative gate to source voltage and causing the active element to "pinch off" which then reduces the current level through the device.

* * * * *